United States Patent
Eleftheriadis et al.

(10) Patent No.: US 12,210,072 B2
(45) Date of Patent: Jan. 28, 2025

(54) REMOTE DIAGNOSTICS OF POWER CABLES SUPPLYING RADIO UNITS IN A RADIO SITE

(71) Applicant: Telefonaktiebolaget LM Ericsson (publ), Stockholm (SE)

(72) Inventors: Lackis Eleftheriadis, Valbo (SE); Bin Sun, Luleå (SE); Xiaoyu Lan, Täby (SE); Saurabh Singh, Vallentuna (SE); Erik Sanders, Vallentuna (SE); Marios Daoutis, Bromma (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 360 days.

(21) Appl. No.: 17/633,618

(22) PCT Filed: Aug. 9, 2019

(86) PCT No.: PCT/SE2019/050735
§ 371 (c)(1),
(2) Date: Feb. 8, 2022

(87) PCT Pub. No.: WO2021/029793
PCT Pub. Date: Feb. 18, 2021

(65) Prior Publication Data
US 2022/0283246 A1 Sep. 8, 2022

(51) Int. Cl.
*G01R 31/58* (2020.01)
*H04B 17/17* (2015.01)
(52) U.S. Cl.
CPC ............ *G01R 31/58* (2020.01); *H04B 17/17* (2015.01)
(58) Field of Classification Search
CPC .. G01R 19/16576; G01R 31/58; H04B 17/17; H04L 12/10; H04L 43/0817; H04L 43/16; H04L 43/50
See application file for complete search history.

(56) References Cited

U.S. PATENT DOCUMENTS 6,594,508 B1 7/2003 Ketonen
9,823,289 B2 11/2017 Pal
(Continued)

FOREIGN PATENT DOCUMENTS

| CN | 105021957 B | 7/2018 |
| WO | WO 2009/103315 A1 | 8/2009 |
| WO | WO 2014/173449 A1 | 10/2014 |

OTHER PUBLICATIONS

Extended European Search Report for European Patent Application No. 19941125.7 mailed Mar. 17, 2023, 11 pages.
(Continued)

*Primary Examiner* — Nguyen T Vo
(74) *Attorney, Agent, or Firm* — Sage Patent Group

(57) ABSTRACT

A method of detecting a defect in a connecting member of a radio unit in a radio site includes applying an artificial radio traffic load to a first radio unit and at least a second radio unit, such that the radio traffic load experienced by the first and the second radio unit is at a same level, measuring power supplied to the first radio unit via a first connecting member and power supplied to the second radio unit via a second connecting member at an end of each connecting member terminating at a device configured to supply power to the radio units, and determining from the measured power and an expected nominal power loss of the first and the second connecting member if there is power loss in at least one of the first and the second connecting member indicating a defect.

11 Claims, 4 Drawing Sheets

(56) References Cited

U.S. PATENT DOCUMENTS

| | | |
|---|---|---|
| 2011/0012608 A1 | 1/2011 | Diab |
| 2012/0306510 A1 | 12/2012 | White et al. |
| 2015/0198639 A1* | 7/2015 | Howald ............... G01R 21/133 |
| | | 702/61 |
| 2015/0316599 A1 | 11/2015 | Weindl et al. |
| 2016/0080242 A1 | 3/2016 | Grosso |
| 2017/0179817 A1* | 6/2017 | Gu .......................... H02M 1/44 |
| 2018/0088648 A1* | 3/2018 | Otani .................... G06F 13/387 |

OTHER PUBLICATIONS

International Search Report and Written Opinion of the International Searching Authority, PCT/SE2019/050735, mailed Apr. 28, 2020, 13 pages.

* cited by examiner

REMOTE DIAGNOSTICS OF POWER CABLES SUPPLYING RADIO UNITS IN A RADIO SITE

CROSS REFERENCE TO RELATED APPLICATIONS

This application is a 35 U.S.C. § 371 national stage application of PCT International Application No. PCT/SE2019/050735 filed on Aug. 9, 2019, the disclosure and content of which is incorporated by reference herein in its entirety.

TECHNICAL FIELD

The present disclosure relates to a method of detecting a defect in a connecting member of at least one of a plurality of radio units in a radio site, and a device performing the method. The present disclosure further relates to a computer program for causing the device to perform the method, and a computer program product comprising a computer readable medium having the computer program embodied thereon.

BACKGROUND

At radio sites, such as roof top sits or tower sites, power cables have a great impact on performance, where deterioration in quality of the power cables including their connectors affects the general performance of the radio site.

Power cables supplying radio units (RUs) of the site with power from a power distribution unit (PDU) may be damaged upon installation of the radio site, may be damaged during operation of the site such as during an ordinary site upgrade or service inspection or their quality may just deteriorate over time for instance as a result of weather conditions.

The power cables may be bundled together for connecting the RUs to the PDU but may also be distributed over the radio site since the RUs not necessarily are located adjacent to each other at the radio site, or may distributed sector-wise. For instance, on a roof top radio site an RU may be placed at every corner of the building for greatest possible radio coverage.

A problem with damaged or imperfect cables, for instance causing poor insulation or shielding, is that performance of the radio site may be affected. For example, a damaged cable shield or cable core may result in increased resistance or increased voltage drop of the power cable and thus increased power loss or may be subjected to interference from adjacent cables or devices.

SUMMARY

One object is to solve, or at least mitigate, this problem in the art and thus to provide a method of detecting a defect in a connecting member of a radio unit in a radio site.

This object is attained in a first aspect of the invention by a method of detecting a defect in a connecting member of at least one of a plurality of radio units in a radio site. The method comprises applying artificial radio traffic load to a first radio unit and at least a second radio unit of the plurality of radio units, such that experienced radio traffic load by the first and the second radio unit is at a same level, measuring power supplied to the first radio unit via a first connecting member and power supplied to the second radio unit via a second connecting member at an end of each connecting member terminating at a device configured to supply power to the plurality of radio units and determining from the measured power and an expected nominal power loss of the first and the second connecting member if there is power loss in at least one of the first and the second connecting member indicating a defect.

This object is attained in a second aspect of the invention by a device configured to detect a defect in a connecting member of at least one of a plurality of radio units in a radio site, the device comprising a processing unit and a memory, said memory containing instructions executable by said processing unit, whereby the device is operative to apply artificial radio traffic load to a first radio unit and at least a second radio unit of the plurality of radio units, such that experienced radio traffic load by the first and the second radio unit is at a same level, measure power supplied to the first radio unit via a first connecting member and power supplied to the second radio unit via a second connecting member at an end of each connecting member terminating at a device configured to supply power to the plurality of radio units and determine from the measured power and an expected nominal power loss of the first and the second connecting member if there is power loss in at least one of the first and the second connecting member indicating a defect.

This object is attained in a third aspect of the invention by a method of detecting a defect in a connecting member of at least one of a plurality of radio units in a radio site. The method comprises applying artificial radio traffic load to said at least one radio unit, measuring a difference between power supplied to the at least one radio unit via the connecting member at an end of the connecting member terminating at a device configured to supply power to the plurality of radio units and power supplied to the at least one radio unit via the connecting member at an end of the connecting member terminating at said at least one radio unit and determining from the measured power difference and an expected nominal power loss of the connecting member if there is power loss in the connecting member indicating a defect.

This object is attained in a fourth aspect of the invention by a device configured to detect a defect in a connecting member of at least one of a plurality of radio units in a radio site, the device comprising a processing unit and a memory, said memory containing instructions executable by said processing unit, whereby the device is operative to apply artificial radio traffic load to said at least one radio unit, measure a difference between power supplied to the at least one radio unit via the connecting member at an end of the connecting member terminating at a device configured to supply power to the plurality of radio units and power supplied to the at least one radio unit via the connecting member at an end of the connecting member terminating at said at least one radio unit and determine from the measured power difference and an expected nominal power loss of the connecting member if there is power loss in the connecting member indicating a defect.

This object is attained in a fifth aspect of the invention by a method of detecting a defect in a connecting member of at least one of a plurality of radio units in a radio site. The method comprises applying artificial radio traffic load to said at least one radio unit, measuring a voltage supplied to the at least one radio unit via the connecting member at an end of the connecting member terminating at said at least one radio unit and at an end of the connecting member terminating at a device configured to supply power to the plurality of radio units and determining if variations in any of the measured voltages exceed a threshold value, wherein the connecting member is indicated to be defect.

This object is attained in a sixth aspect of the invention by a device configured to detect a defect in a connecting member of at least one of a plurality of radio units in a radio site, the device comprising a processing unit and a memory, said memory containing instructions executable by said processing unit, whereby the device is operative to apply artificial radio traffic load to said at least one radio unit, measure a voltage supplied to the at least one radio unit via the connecting member at an end of the connecting member terminating at said at least one radio unit and at an end of the connecting member terminating at a device configured to supply power to the plurality of radio units and determine if variations in any of the measured voltages exceed a threshold value, wherein the connecting member is indicated to be defect.

In an aspect, artificial radio traffic load is applied to a first radio unit and a second radio unit such that total radio traffic load experienced by the first and the second radio unit—i.e. artificial load plus actual load—is at a same level for both radio units. Further, the artificial radio traffic level is applied such that the level of the radio traffic load experienced by the first and second radio unit does not vary much. It may be envisaged that the artificial radio traffic is applied such that the level of the experienced radio traffic load is only allowed to vary in a predetermined—relatively small—span over a given time period during which the power is measured. In an example, the level may be allowed to vary in a span being 4-6% higher than a predicted maximal actual load caused by mobile terminal served by the first and the second radio unit.

Thereafter, power supplied to a first power cable and a second power cable is measured while the total traffic load of the first radio unit and second radio unit is held at the same high level by means of the applied varying artificial load.

Now, the power being output from the power cables at each radio unit should be the same for each radio unit since the applied artificial load will have both radio units experience the same total radio traffic load.

Hence, by measuring the power supplied to the first power cable and the second power cable, it can be concluded whether or not any one of the two power cables is defect; should the two measured power levels differ substantially, then one of the cables is likely to be defect.

Thus, it is determined from the measured power and the expected nominal power loss of the first power cable and the second power cable if there is power loss in any one of the first and second power cables (or in the connectors connecting the power cables in each end indicating a defect.

Advantageously, the defect detected in a power cable may result in maintenance personnel being alerted, for instance by sending a service order to a maintenance centre, such that the defect power cable may be repaired or replaced. If the defect is considered serious, the corresponding radio unit may be temporarily shut down, and any traffic may be reallocated to one or more of the other radio units. Hence, with the described embodiment, it is possible to remotely monitor status of power cables at a radio site.

In an embodiment, the artificial radio traffic load is applied such that total radio traffic load experienced by the radio unit to which the load is applied is does not vary outside a determined span.

In an embodiment, the expected nominal power loss of a connecting member is acquired from a specification of the connecting member or measured during installation of the connecting member.

In an embodiment, a machine learning (ML) model determines the expected nominal power loss of the first and the second connecting member before the first and the second connecting member is installed at the radio site.

Further embodiments will be described in the detailed description.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

Aspects and embodiments are now described, by way of example, with reference to the accompanying drawings, in which.

DETAILED DESCRIPTION

The aspects of the present disclosure will now be described more fully hereinafter with reference to the accompanying drawings, in which certain embodiments of the invention are shown.

These aspects may, however, be embodied in many different forms and should not be construed as limiting; rather, these embodiments are provided by way of example so that this disclosure will be thorough and complete, and to fully convey the scope of all aspects of invention to those skilled in the art. Like numbers refer to like elements throughout the description.

Figure 1:
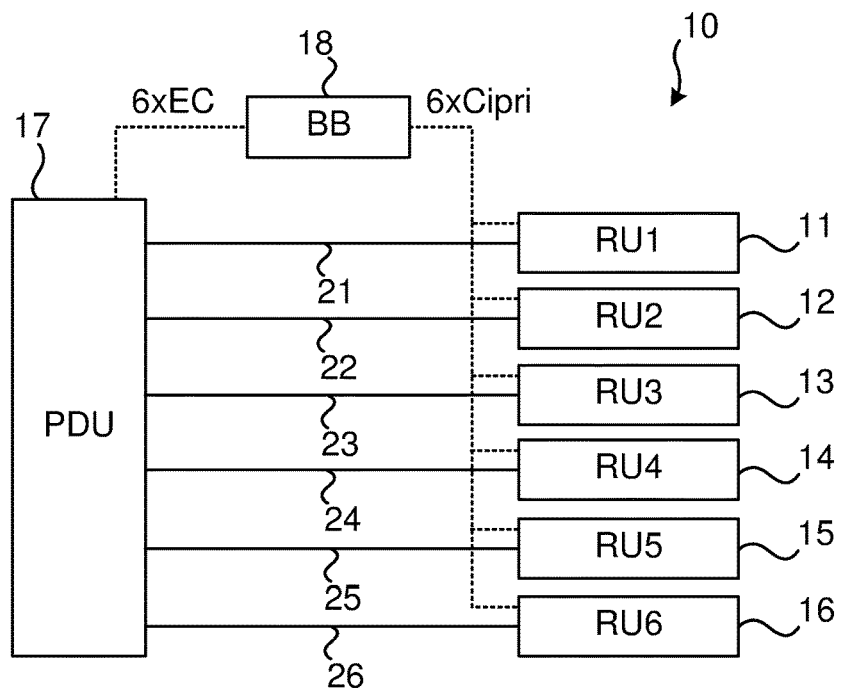
FIG. 1 illustrates a radio site in which embodiments may be implemented.

FIG. 1 illustrates a radio site 10 in which embodiments may be implemented. The radio site 10 comprises six radio units (RUs, 11-16) located for instance on a roof top and/or in a radio tower. The site 10 further comprises a power distribution unit (PDU, 17) configured to supply each one of the RUs 11-16 with power via a respective power cable 21-26. Further shown is a baseband (BB) unit 18 via which the RUs 11-16 are configured to communicate with for instance a radio base station (RBS) which may be part of, or separate from, the PDU 17.

A protocol commonly being used in the communication between the BB unit 18 and the RUs 11-16 is Common Public Radio Interface (CPRI) or evolved CPRI (eCPRI). The CPRI thus defines an interface between REC (Radio Equipment Control) and RE (Radio Equipment). For instance, the REC may be the PDU 17 or an RBS located on the ground while the RE may be an RU located in a tower and connected to the PDU/RBS via a fibre optic link.

As previously mentioned, damaged or imperfect cables may affect the performance of the radio site 10. It is thus be desirable to be capable of monitoring status of the power cables 21-26 and detect any deterioration in the performance of the cables 21-26.

In the art, this is typically performed such that indications are given in the form of for instance increased power consumption of the radio site 10 whereupon maintenance personnel are ordered to visit the site 10 to perform manual measurements to determine whether or not something is wrong with the power cables 21-26, which is a tedious and resource-consuming approach.

Figure 2:
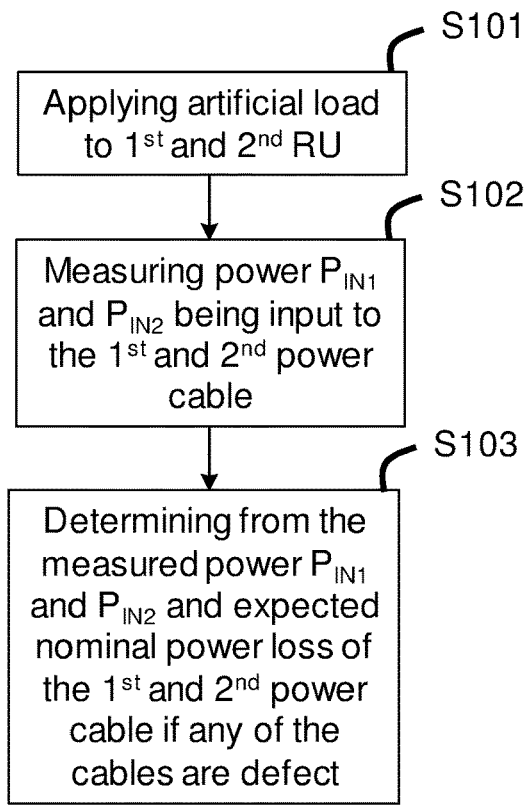
FIG. 2 shows a flowchart illustrating a method of detecting a defect in a connecting member of at least one of a plurality of radio units in a radio site according to an embodiment.

FIG. 2 shows a flowchart illustrating a method of detecting a defect in a connecting member of at least one of a plurality of radio units in a radio site according to an embodiment, where "connecting member" denotes a power cable 21 and/or a connector configured to connect the power cables 21-26 in one end to the PDU 17 and in the other end to the respective RU 11-16. Hence, even though a power cable may not be damaged, a connector very well may be, which may deteriorate overall performance to the same extent as a damaged power cable.

Figure 3:
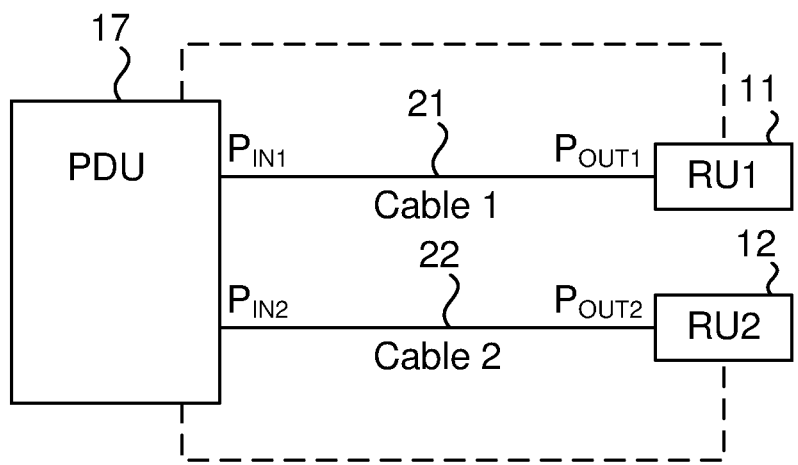
FIG. 3 shows an exemplifying configuration in which a defect power cable is detected according to an embodiment.

FIG. 3 shows an exemplifying configuration where it will be determined if a first power cable 21 connected between the PDU 17 and a first RU 11 is defect or if a second power cable 22 connected between the PDU 17 and a second RU 12 is defect. Power being input by the PDU 17 into the power cables 21, 22 at an end of the cables terminating at the PDU 17 is denoted $P_{IN1}$ and $P_{IN2}$, respectively, while power being output from the power cables 21, 22 into the first RU 11 and the second RU 12 at an end of the cables terminating at the RUs is denoted $P_{OUT1}$ and $P_{OUT2}$. It is noted that the BB unit 18 is not shown in FIG. 3.

The dotted lines indicate that the RUs 11, 12 are capable of communicating with the PDU 17 and vice versa.

In this embodiment, artificial traffic load will be introduced in the first RU 11 and the second RU 12. This may be attained by using a so-called Air Interface Load Generator (AILG) arranged in each RU.

Such an AILG may utilize a method of generating artificial traffic load commonly known as physical resource block (PRB) padding.

Figure 4:
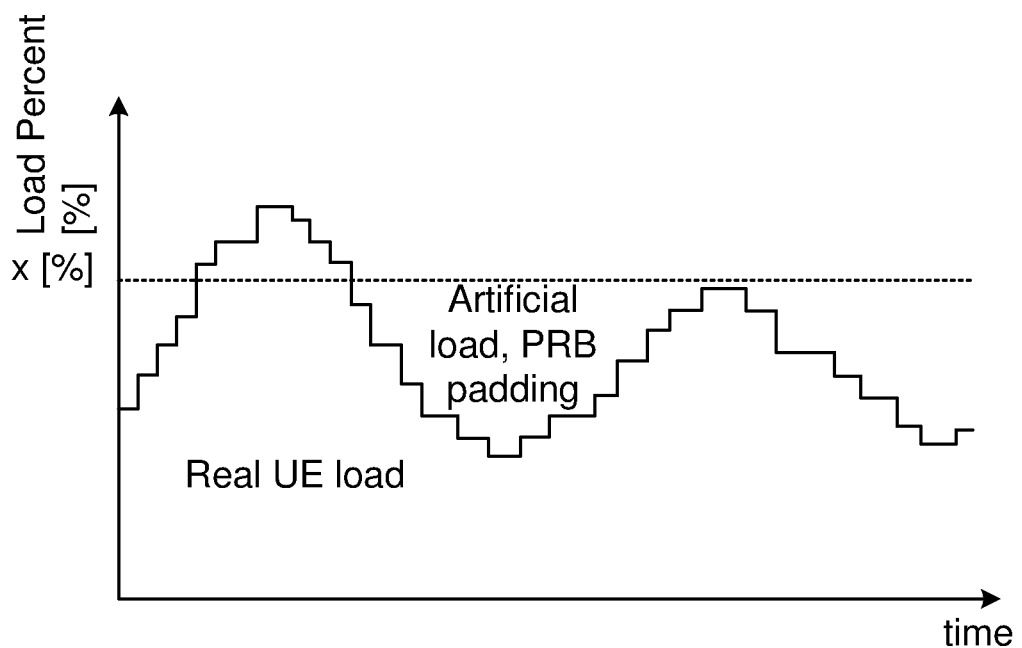
FIG. 4 illustrates application of artificial radio traffic load in a radio unit according to an embodiment.

Reference is further made to FIG. 4, where it is illustrated that an RU will experience a real, actual traffic load caused by mobile terminals such as smart phones, tablets, laptops, etc., served by the RU. These mobile terminals will be referred to as User Equipment (UE). In addition to the actual traffic load, artificial load will in this embodiment be applied to the RU such that total traffic load experienced by the RU—i.e. applied artificial load plus actual load—is at a high, even level (denoted x in FIG. 4) after an initial transient period where the artificial load is applied to the RU. It should be noted that this artificial load will not affect any UEs served by the RU.

In practice, the AILG is controlled to generate an artificial traffic load at a level such that the experienced total traffic load of an RU would become e.g. 5% higher than a predicted maximal actual load caused by the UEs served by the RU, with a confidence interval of, say, 99.7%.

As a consequence, power consumed by the RU in view of the total experienced traffic load will also be at an even level, and not vary with the actual traffic load to which the RU is subjected, which variations in practice typically are rapid.

With reference again to FIG. 2, in a first step S101, artificial radio traffic load is thus applied to the first radio unit 11 and the second radio unit 12. The artificial load is applied to the first radio unit 11 and the second radio unit 12 such that total radio traffic load experienced by the first and the second radio unit 11, 12—i.e. artificial load plus actual load—is at a same level for both RUs 11, 12. This could be performed for the first radio unit 11 and the second radio unit 12 either simultaneously or sequentially.

Further, as previously has been illustrated in FIG. 4, the artificial radio traffic level is applied such that the level x of the radio traffic load experienced by the first and second RU 11, 12 does not vary much. It may be envisaged that the artificial radio traffic is applied such that the level x of the experienced radio traffic load is only allowed to vary in a predetermined—relatively small—span over a given time period during which the power is measured. In an example, the level x may be allowed to vary in a span being 4-6% higher than a predicted maximal actual load caused by the UEs served by the first and the second RU 11, 12.

In a second step S102, the power $P_{IN1}$, $P_{IN2}$ supplied to the first power cable 21 and the second power cable 22, respectively, by the PDU 17 is measured while the total traffic load of the first RU 11 and second RU 12 is held at the same high level x by means of the applied varying artificial load as illustrated in FIG. 4.

Now, the power $P_{OUT1}$, $P_{OUT2}$ being output from the power cables 21, 22 into the first RU 11 and the second RU 12 at an end of the cables terminating at the RUs should be the same for each RU 11, 12 since the applied artificial load will have both RUs experience the same total radio traffic load.

In this exemplifying embodiment, the first power cable 21 and the second power cable 22 are assumed to be of the same type and the same length, meaning that unless any one of the two cables is defect, the cables should present the same power loss. That is, the two power cables 21, 22 should present a same expected nominal power loss.

Hence, by measuring the power $P_{IN1}$, $P_{IN2}$ supplied to the first power cable 21 and the second power cable 22 by the PDU 17 in step S102, it can be concluded whether or not any one of the two power cables 21, 22 is defect; should $P_{IN1}$ differ substantially from $P_{IN2}$—say for instance that $P_{IN1}$=700 W while $P_{IN2}$=800 W—then the second power cable 22 is likely to be defect. For instance, the second power cable 22 may suffer from breakage in its shield resulting in a higher power loss than expected.

Thus, in step S103, it is determined from the measured power $P_{IN1}$, $P_{IN2}$ and the expected nominal power loss of the first power cable 21 and the second power cable 22 if there is power loss in any one of the first and second power cables 21, 22 (or in the connectors connecting the power cables to the PDU and the RUs) indicating a defect.

Advantageously, the defect detected in the second power cable 22 in the above example may result in maintenance personnel being alerted, for instance by sending a service order to a maintenance centre, such that the second power cable 22 may be repaired or replaced. If the defect is considered serious, the second RU 12 may be temporarily shut down. Any traffic handled by the second RU 12 may be reallocated to one or more of the other RUs. Hence, with the described embodiment, it is possible to remotely monitor status of power cables at a radio site 10.

In the above example, it was assumed that the two power cables 21, 22 were of the same type and the same length (and that the RUs were of the same type), i.e. the two power cables have the same expected nominal power loss. However, that is not necessarily the situation at a radio site, in which case differences in expected nominal power loss of the power cables 21, 22 must be taken into account.

For instance, an expected nominal power loss found in the power cable specification based on physical properties such as material and type of cable, internal impedance, wire gauge, wire length, ambient temperature, circular mil, voltage drop, etc., may be taken into account. It may also be envisaged that the expected nominal power loss of the cables 21, 22 is measured during installation of the cables. The first option has the advantage that in case any cable is damaged during the installation, a correct power loss value is still used, while the second option has the alternative that actual radio site conditions are taken into account.

As a result, in case of different types of power cables 21, 22 being utilized, a measured input power of $P_{IN1}$=700 W and $P_{IN2}$=800 W could indeed imply that there is no defect in the cables, if for instance the second power cable 22 has an expected nominal power loss being 100 W higher than that of the first power cable 21 due to a greater cable length. Thus, the expected nominal power loss of the power cables must be taken into account when determining whether or not one or more cables are defect.

As is understood, if all six RUs 11-16 are of the same type, there is no need to distinguish between individual RUs. However, there may also be a situation where e.g. three RUs 11-13 are of one type while the remaining three RUs 14-16 are of another type. In such a scenario, it may be necessary to detect any defects in cables 21-23 by comparing the RUs 11-13 in the first group and to detect any defects in cables 24-26 by comparing the RUs 14-16 in the second group; comparison of an RU in the first group with an RU in the second group may result in an incorrect conclusion.

Figure 5:
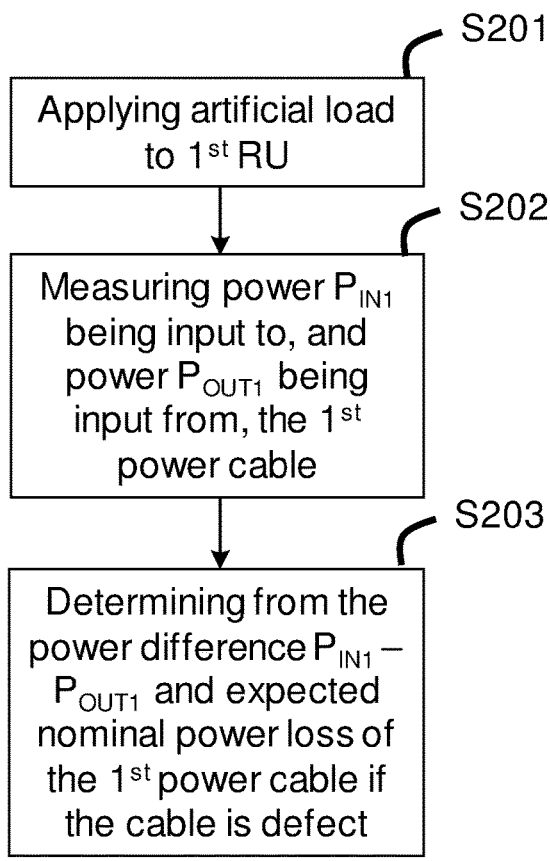
FIG. 5 shows a flowchart illustrating a method of detecting a defect in a connecting member of at least one of a plurality of radio units in a radio site according to another embodiment.

In another aspect, with reference to a flowchart of FIG. 5 and the previously described configuration of FIG. 3, if power $P_{OUT1}$ supplied to an RU, such as the first RU 11, from a power cable 21 is measured in addition to measuring the power $P_{IN1}$ supplied to the power cable 21 by the PDU 17 upon applying artificial load, any defect of the power cable 21 may be determined without involving further RUs.

In a first step S201, artificial radio traffic load is applied to the first radio unit 11. Again, the artificial load is applied to the first radio unit 11 such that total radio traffic load experienced by the first radio unit 11—i.e. artificial load plus actual load—is at an even level. That is, as previously has been illustrated in FIG. 4, the artificial radio traffic level is applied such that the level x of the radio traffic load experienced by the first RU 11 does not vary much. As previously has been discussed, it may be envisaged that the artificial radio traffic is applied such that the level x of the experienced radio traffic load is only allowed to vary in a predetermined—relatively small—span over a given time period during which the power is measured.

In a second step S202, the power $P_{IN1}$ supplied to the first power cable 21 by the PDU 17 is measured at the end of the cable terminating at the PDU 17, as is the power $P_{OUT1}$ supplied to the first RU 11 via the first power cable 21 at an end of the first power cable 21 terminating at the first RU 11, wherein the power difference $P_{IN1}-P_{OUT1}$ is determined.

Hence, assuming that $P_{IN1}$=700 W is supplied to the first power cable 21 by the PDU 17 and that $P_{OUT1}$=500 W is supplied to the first RU 11 at the other end of the power cable 21; if the expected nominal power loss of the first power cable 21 is known (e.g. from specification or from measurement) to be approximately 200 W, then there is no indication of a defect in the first cable 21.

If on the other hand the expected nominal power loss of the first power cable is known to be e.g. approximately 100 W, then there is a clear indication of a defect in the first power cable 21 since the actual power loss of the first power cable 21 is twice that of the expected nominal power loss.

Thus, in step S203, it is determined from the measured power difference $P_{IN}-P_{OUT1}$ and the expected nominal power loss of the first power cable 21 if there is power loss in the cable 21 indicating a defect.

Figure 6:
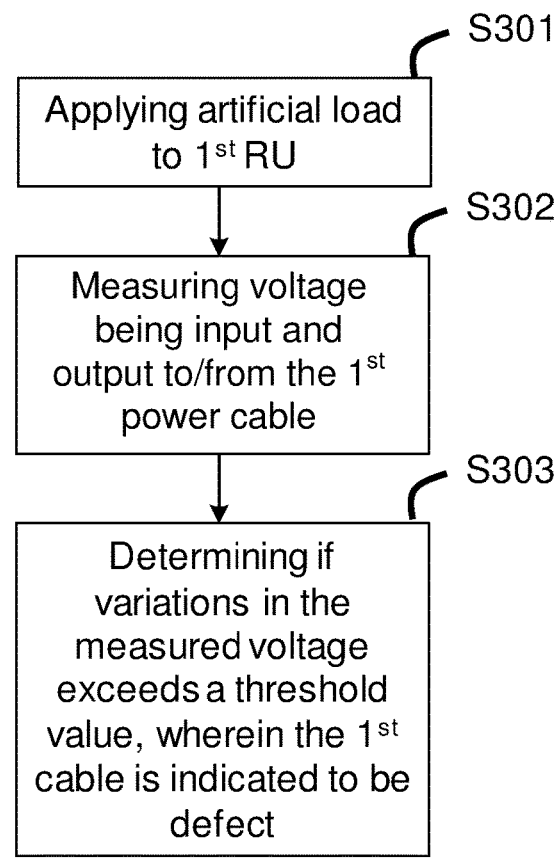
FIG. 6 shows a flowchart illustrating a method of detecting a defect in a connecting member of at least one of a plurality of radio units in a radio site according to a further embodiment.
Figure 7:
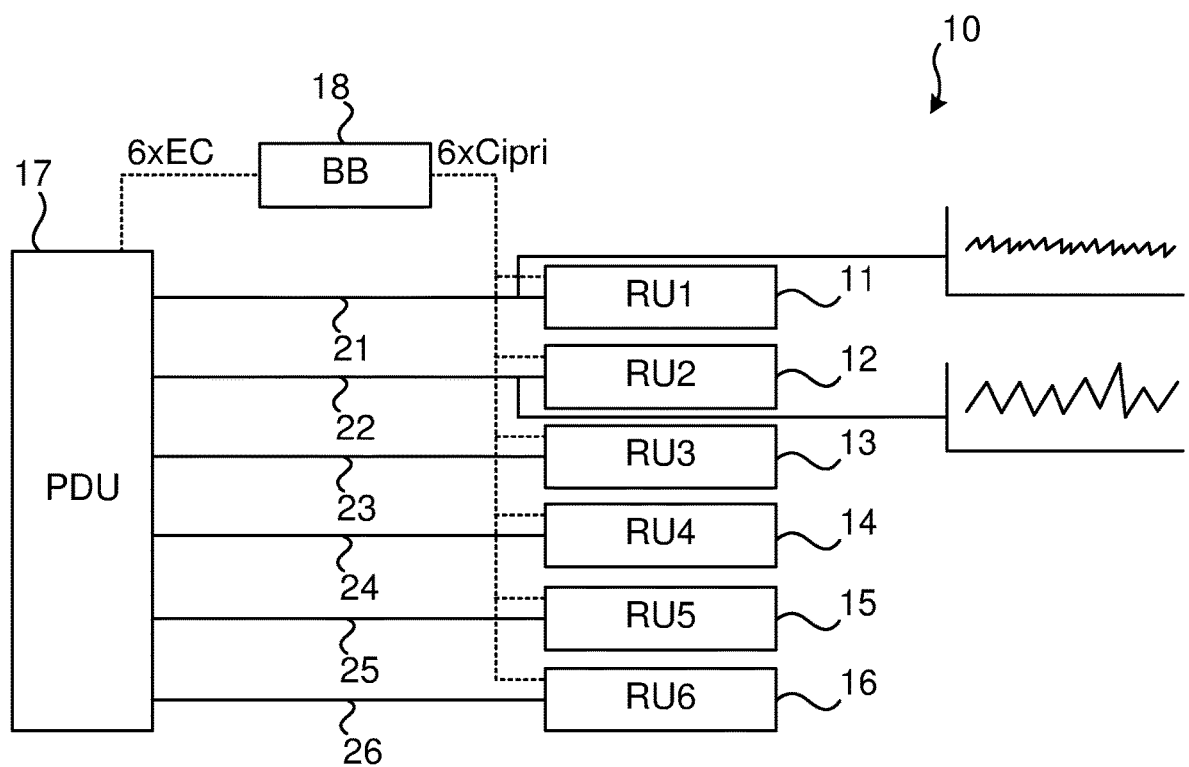
FIG. 7 illustrates the radio site of FIG. 1 with voltages measured at an input of a first radio unit and a second radio unit according to embodiments.

In a further aspect, with reference to a flowchart of FIG. 6 and a configuration of FIG. 7 showing the setup of FIG. 1 with illustrations of voltage variations at the input of the first RU 11 and the second RU 12, a defect of a power cable may be detected by determining interference among two or more adjacent power cables. In this aspect, artificial load is applied to the first RU 11 while no artificial load is applied to the second RU 12. Hence, the second RU 12 is only subjected to the radio traffic load caused by the UEs it is serving. It is noted that for inter-cable interference to be detected, the first RU 11 and the second RU 12 must be physically placed reasonably adjacent to each other for the two RUs 11, 12 to actually be physically capable of affecting each other in terms of interference. However, even if two cables are not located adjacent to each other, a cable could still be subjected to interference from for instance air-interface radio emissions or lightning.

In a first step S301, artificial radio traffic load is thus applied to the first radio unit 11 while no artificial load is applied to the second radio unit 12 (or any other of the RUs, even if this example only mentions the first RU 11 and the second RU 12), which thus only will experience actual traffic load caused by the UEs it is serving. It may be envisaged that artificial radio traffic load is applied in sequence to the RUs, either to a single RU or to groups of RUs, i.e. one-by-one, to-by-two, three-by-three, etc. This may be performed using an appropriate machine learning (ML) algorithm.

Again, the artificial load is applied to the first radio unit 11 such that total radio traffic load experienced by the first radio unit 11—i.e. artificial load plus actual load—is at an even level. That is, as previously has been illustrated in FIG. 4, the artificial radio traffic level is applied such that the level x of the radio traffic load experienced by the first RU 11 does not vary much. As previously has been discussed, it may be envisaged that the artificial radio traffic is applied such that the level x of the experienced radio traffic load is only allowed to vary in a predetermined—relatively small—span over a given time period during which the power is measured.

The actual traffic load to which the second RU 12 is subjected typically changes rapidly, while the traffic load experienced by the first RU 11 will be at an even level.

In step S302, a voltage being output to the first RU 11 is measured at the end of the first power cable 21 terminating at the first RU 11 and at the end of the first power cable 21 terminating at the PDU 17.

When measuring the voltage being output at the end of the first cable 21 terminating at the first RU 11 and at the end of the first power cable 21 terminating at the PDU 17 in step S302, variations in the measured voltage should—in case the first power cable 21 is not defect—be small due to the even radio traffic load experienced by the first RU 11. It is noted that a situation could arise where variations in the measured voltage is great at one end of the cable 21 but smaller at the other. For instance, if the variations are great at the end of the first power cable 21 terminating at the PDU 17, while begin small at the end of the first power cable 21 terminating at the first RU 11, this would imply that the first power cable 21 is subjected to interference at the PDU end, but not at the RU end.

To the contrary, if a voltage would be measured at the end of the second cable 21 terminating at the second RU 12 and at the end of the second cable 21 terminating at the PDU 17, variations in the measured voltage would likely be great, since the variations would follow the variation in actual traffic load experienced by the second RU 12.

Thus, by measuring the voltage at the end of the first cable 21 terminating at the first RU 11 and at the end of the first power cable 21 terminating at the PDU 17 in step S302 and determining in step S303 whether or not the variations are sufficiently small at each end of the first cable 21, e.g. that the variations in voltage do not exceed a predetermined threshold value, it may be concluded whether or not the first power cable 21 is defect.

If the measured voltage variations are sufficiently small, it is determined in step S303 that the first power cable 21 does not suffer from any defects. On the other hand, if the voltage variations exceed the threshold value, it is concluded in step S303 that the first power cable 12 is subjected to interference from e.g. the (greatly varying) signals carried over the second power cable 22 or air interface radio emissions. Such interference will only occur in case there is some defect in the first power cable 21, such as a damaged cable shield.

Thereafter, the method may proceed with applying artificial traffic load to the second RU 12 while not applying artificial load to any other of the RUs (or at least not to an adjacently located RU), and so on, until all power cables 21-26 have been tested.

The method of determining a defect of a power cable 21 may for instance be performed by the RU 11 to which the power cable is connected, by the PDU 17, by the BB unit 18 or even by a remotely located device being in communication with the PDU 17 and/or the RUs 11-16.

In an embodiment, with reference to FIG. 4, when applying an artificial radio traffic load to one or more of the RUs 11-16, where the level x of the experienced total traffic load should be relatively non-fluctuating, the artificial radio traffic load is applied such that the experienced total traffic load of an RU is slightly higher than the highest expected actual traffic load, such as 5% higher. The highest expected actual traffic load may be predicted using machine learning (ML) implemented at each RU.

In a further embodiment, the artificial radio traffic load is applied such that the level of the experienced total traffic load of an RU does not fluctuate more than 5% over a given measurement period, such as 60 seconds.

Figure 8:
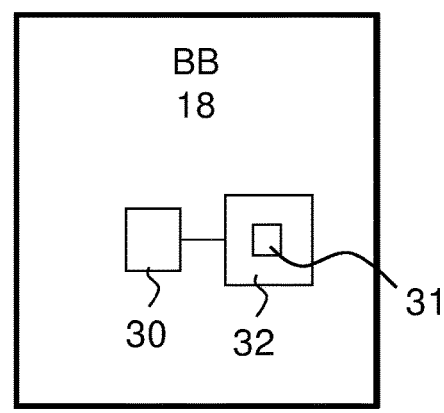
FIG. 8 illustrates a device configured to detect a defect in a power cable according to an embodiment.

FIG. 8 illustrates a BB unit 18 according to an embodiment. The steps of the method performed by the BB unit 18 of detecting a defect in a power cable (or connector) of an RU in a radio site are in practice performed by a processing unit 30 embodied in the form of one or more microprocessors arranged to execute a computer program 31 downloaded to a suitable storage volatile medium 32 associated with the microprocessor, such as a Random Access Memory (RAM), or a non-volatile storage medium such as a Flash memory or a hard disk drive. The processing unit 30 is arranged to cause the BB unit 18 to carry out the method according to embodiments when the appropriate computer program 31 comprising computer-executable instructions is downloaded to the storage medium 32 and executed by the processing unit 30. The storage medium 32 may also be a computer program product comprising the computer program 31. Alternatively, the computer program 21 may be transferred to the storage medium 32 by means of a suitable computer program product, such as a Digital Versatile Disc (DVD) or a memory stick. As a further alternative, the computer program 31 may be downloaded to the storage medium 32 over a network. The processing unit 30 may alternatively be embodied in the form of a digital signal processor (DSP), an application specific integrated circuit (ASIC), a field-programmable gate array (FPGA), a complex programmable logic device (CPLD), etc.

Hence, the BB unit 18 should be capable of signalling to the RUs that an artificial load should be applied, and also to continuously send control signals to the RUs to control the level of the applied artificial load such that total experienced load is maintained at an even level during measuring of power or voltage variations. The BB unit 18 is typically capable of measuring power and/or voltage at each end of a power cable. Alternatively, the BB unit 18 is capable of communicating with the PDU 17 and the respective RU 11-16 in order to acquire power and/or voltage values measured at the end of the power cable terminating at the PDU 17 and terminating at said respective RU 11-16.

As previously mentioned, ML may be implemented in the device performing the method of detecting cable or connector defects, for instance the BB unit 18. Thus, such ML algorithms executing on the BB unit 18 may process power and/or voltage measured at the PDU 17 and the RUs 11-16 to determine any power differences or interferences for detecting defects in the power cables 21-26.

As the experienced radio traffic situation, and thus power and voltage values, changes rapidly, oftentimes with non-recurring patterns, traditional math-based parametric models cannot conduct effective analysis and prediction since these are not able to adapt to such fast-changing patterns. Thus, non-parametric ML algorithms should be used for the detection.

An appropriately designed ML model may for instance:
measure instantaneous radio traffic load for the RUs,
estimate a maximum radio traffic load for the RUs,
control the applying of artificial radio traffic load,
measure RU input power and voltage levels,
measure PDU output power and voltage levels,
determine expected nominal power loss of a cable, e.g. during installation of a site, etc.

It is further envisaged that the ML model may determine expected nominal power loss of a cable even before installation has occurred, which advantageously would take into account a scenario where the cable is damaged during installation.

The aspects of the present disclosure have mainly been described above with reference to a few embodiments and examples thereof. However, as is readily appreciated by a person skilled in the art, other embodiments than the ones disclosed above are equally possible within the scope of the invention, as defined by the appended patent claims.

Thus, while various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A method of detecting a defect in a connecting member of at least one of a plurality of radio units in a radio site, comprising:
applying artificial radio traffic load to said at least one radio unit;
while applying artificial radio traffic load to said at least one radio unit, measuring a difference between power supplied to the at least one radio unit via the connecting member at an end of the connecting member terminating at a device configured to supply power to the plurality of radio units and power supplied to the at least one radio unit via the connecting member at an end of the connecting member terminating at said at least one radio unit; and
determining from the measured power difference and an expected nominal power loss of the connecting member if there is power loss in the connecting member indicating a defect.

2. The method of claim 1, wherein the artificial radio traffic load is applied such that total radio traffic load experienced by the radio unit, to which the load is applied, does not vary outside a determined span, wherein the total radio traffic load includes the artificial radio traffic load and actual radio traffic load.

3. The method of claim 1, wherein the expected nominal power loss of a connecting member is acquired from a specification of the connecting member or measured during installation of the connecting member.

4. The method of claim 1, wherein a machine learning model determines the expected nominal power loss of the connecting member before the connecting member is installed at the radio site.

5. The method of claim 1, the steps of the method being performed by a machine learning model.

6. A computer program product comprising a non-transitory storage medium including computer-executable instructions for causing a device to perform steps recited in claim 1 when the computer-executable instructions are executed on a processing unit included in a device.

7. A device configured to detect a defect in a connecting member of at least one of a plurality of radio units in a radio site, the device comprising a processing unit and a memory, said memory containing instructions executable by said processing unit, whereby the device is operative to:
apply artificial radio traffic load to said at least one radio unit;
while applying artificial radio traffic load to said at least one radio unit, measure a difference between power supplied to the at least one radio unit via the connecting member at an end of the connecting member terminating at a device configured to supply power to the plurality of radio units and power supplied to the at least one radio unit via the connecting member at an end of the connecting member terminating at said at least one radio unit; and
determine from the measured power difference and an expected nominal power loss of the connecting member if there is power loss in the connecting member indicating a defect.

8. The device of claim 7, wherein the artificial radio traffic load is applied such that total radio traffic load experienced by the radio unit, to which the load is applied, does not vary outside a determined span, wherein the total radio traffic load includes the artificial radio traffic load and actual radio traffic load.

9. The device of claim 7, wherein the expected nominal power loss of a connecting member is acquired from a specification of the connecting member or measured during installation of the connecting member.

10. The device of claim 7, wherein a machine learning model determines the expected nominal power loss of the connecting member before the connecting member is installed at the radio site.

11. The device of claim 7, the operations of the device being performed by a machine learning model.

* * * * *

UNITED STATES PATENT AND TRADEMARK OFFICE
CERTIFICATE OF CORRECTION

PATENT NO. : 12,210,072 B2  
APPLICATION NO. : 17/633618  
DATED : January 28, 2025  
INVENTOR(S) : Eleftheriadis et al.

Page 1 of 1

It is certified that error appears in the above-identified patent and that said Letters Patent is hereby corrected as shown below:

On the Title Page

In Column 1, below Item "(65)", insert -- Related U.S. Application Data (63) Continuation-in-part of PCT/SE2019/050735, filed on Aug. 09, 2019. --, therefor.

In the Drawings

In Fig. 3, Sheet 2 of 4, delete "FigUre 3" and insert -- Figure 3 --, therefor.

In the Specification

In Column 1, Line 27, delete "sits" and insert -- sites --, therefor.

In Column 3, Line 49, delete "(or" and insert -- or --, therefor.

In Column 3, Line 62, delete "is does not" and insert -- does not --, therefor.

In Column 8, Line 14, delete "$P_{IN}-P_{OUT1}$" and insert -- $P_{IN1}-P_{OUT1}$ --, therefor.

In Column 9, Line 7, delete "begin" and insert -- beginning --, therefor.

Signed and Sealed this  
Twenty-first Day of October, 2025

John A. Squires  
*Director of the United States Patent and Trademark Office*